United States Patent
Lemay et al.

(10) Patent No.: US 6,417,729 B1
(45) Date of Patent: Jul. 9, 2002

(54) LINEAR POWER CONTROL LOOP

(75) Inventors: Normand T. Lemay, Minneapolis; Brian T. Brunn, Lakeville, both of MN (US); John W. MacConnell, Spokane, WA (US); Eric Sadowski, Indianapolis, IN (US); Eric W. Lofstad, Eagan, MN (US)

(73) Assignee: Itron, Inc., Spokane, WA (US)

( * ) Notice: Subject to any disclaimer, the term of this patent is extended or adjusted under 35 U.S.C. 154(b) by 0 days.

(21) Appl. No.: 09/491,538

(22) Filed: Jan. 26, 2000

Related U.S. Application Data

(60) Provisional application No. 60/120,641, filed on Feb. 18, 1999.

(51) Int. Cl.[7] .................................................. H03G 3/20
(52) U.S. Cl. ....................................... 330/129; 330/140
(58) Field of Search ............................... 330/129; 4/140, 4/285, 350; 327/346

(56) References Cited

U.S. PATENT DOCUMENTS

| | | | |
|---|---|---|---|
| 2,853,601 A | 9/1958 | McKenna et al. ............ 250/20 |
| 3,248,654 A | 4/1966 | Shiragaki ....................... 328/3 |
| 3,460,041 A | 8/1969 | Orwin et al. ................... 325/50 |
| 3,668,533 A | 6/1972 | Fish et al. ................... 328/168 |
| 4,205,263 A | 5/1980 | Kawagai et al. ........... 323/22 R |
| 4,355,414 A | 10/1982 | Inoue .......................... 455/184 |
| 4,379,272 A | 4/1983 | Wheatley .................... 330/144 |
| 4,412,337 A | 10/1983 | Bickley et al. ................ 375/60 |
| 4,656,630 A | 4/1987 | Miyo .......................... 370/104 |
| 4,757,502 A | 7/1988 | Meuriche et al. ............ 370/104 |
| 5,054,116 A | 10/1991 | Davidson ..................... 455/126 |
| 5,128,629 A | 7/1992 | Trinh .......................... 330/129 |
| 5,214,393 A | * 5/1993 | Aihara ........................ 330/129 |
| 5,252,929 A | * 10/1993 | Taroumaru ................... 330/129 |
| 5,334,945 A | * 8/1994 | Yokoya et al. .............. 330/129 |
| 5,371,473 A | 12/1994 | Trinh et al. .................. 330/129 |
| 5,434,537 A | * 7/1995 | Kukkonen ................... 330/140 |
| 5,675,611 A | * 10/1997 | Lehtinen ......................... 330/2 |
| 5,712,593 A | * 1/1998 | Buer et al. ................... 330/129 |
| 5,796,309 A | * 8/1998 | Nguyen ....................... 330/140 |
| 5,841,319 A | * 11/1998 | Sato ............................ 330/129 |
| 5,977,833 A | * 11/1999 | Attimont et al. ............ 330/297 |
| 5,990,712 A | * 11/1999 | Corman et al. ............. 330/129 |

* cited by examiner

*Primary Examiner*—Robert Pascal
*Assistant Examiner*—Khanh Van Nguyen
(74) *Attorney, Agent, or Firm*—Patterson, Thuente, Skaar & Christensen, P.A.

(57) ABSTRACT

The present invention presents a closed loop system that utilizes a non-linear reference to control a power amplifier's output power in order to obtain a linear transfer function of dB per adjustment step of a reference input. The closed loop system demonstrates that each non-linear stage/step in an automatic gain control system can create a linear closed loop system when using a non-linear reference. The closed loop system of the present invention eliminates the need for a linearization circuit for the system's power detector. The closed loop system may be used with most power amplifiers when linear control in terms of dB vs. adjustment setting of the input reference signal is desired. Output power in terms of dBms can be accurately set in linear steps where power control over a wide dynamic range is desired.

17 Claims, 7 Drawing Sheets

LINEAR POWER CONTROL LOOP

RELATED APPLICATION

The present application claims the benefit of U.S. provisional application No. 60/120,641, filed Feb. 18, 1999, incorporated herein by reference.

FIELD OF THE INVENTION

This invention relates to automatic gain control loops and, more particularly, to an automatic gain control loop that uses a non-linear reference to linearize the closed loop system.

BACKGROUND OF THE INVENTION

There are various techniques for linearizing the response of an automatic gain control loop to control an amplifier's output power. One technique employs a logarithmic amplifier positioned after a power detector, which detects exponential response of the power amplifier, in order to linearize the overall loop response; the logarithm of an exponential response yields a linear transfer function. Another technique includes an "inverse plant block" for compensation. An "inverse plant block" takes the non-linear transfer function of the closed loop and maps it to a circuit which will duplicate its exact inverse response. Other techniques make use of variable attenuators which have linear control in terms of dBs of attenuation, allowing for a linear control loop to be developed. Still other techniques take advantage of a linear "received signal strength indicator" (RSSI) for detection which can provide a linear transfer function in terms of Volts/dBm.

Each of the above techniques requires linearization of the output of the power detector or other types of additional circuitry which add substantial cost to the linear power control loop. Further, each of the above techniques is likely subject to significant changes in expected output due to temperature variations to which the linear power control loop may be subjected.

Thus, in view of the above, there is a need for a linear power control loop which does not require linearization of the output of the power detector, which does not require substantial amounts of additional circuitry, and which can maintain a substantially reliable linear output over a wide range temperature variations while providing a low cost to the user.

SUMMARY OF THE INVENTION

The needs described above are in large measure met by a linear power control loop of the present invention. Specifically, the present invention presents a closed loop system that utilizes a non-linear reference to control a power amplifier's output power in order to obtain a linear transfer function of dB per adjustment step of a reference input. The closed loop system demonstrates that each non-linear stage/step in an automatic gain control system can create a linear closed loop system when using a non-linear reference. The closed loop system of the present invention eliminates the need for a linearization circuit for the system's power detector. The closed loop system may be used with most power amplifiers when linear control in terms of dB vs. adjustment setting of the input reference signal is desired. Output power in terms of dBms can be accurately set in linear steps where power control over a wide dynamic range is desired.

The linear power control loop generally includes a power amplifier, a power detector, an adjustable, non-linear reference signal, and a comparator. The power amplifier is provided with a power input signal and a control input to which, in response thereto, produces a substantially linear, transfer function due to feedback control from the loop. The power amplifier on its own is a non-linear device whose output power, in dBm, responds non-linearly to an input control voltage. The power detector operates to determine the magnitude of the output power of the power amplifier and to produce a voltage output. This voltage output, which is generally non-linear in nature but proportional to the input power, is compared, by virtue of the comparator, with the adjustable, non-linear reference signal. The output of the comparator represents the difference between the power detector output and the non-linear reference signal. The output of the comparator is provided to the power amplifier in the form of the control input voltage. Each adjustment in the non-linear reference signal produces a variation in the power output of the loop; the power output with respect to the reference signal, i.e., the closed loop transfer function, is linear. The adjustments made to the reference signal are preferably made in linear steps.

The adjustable, non-linear reference signal is preferably provided by a programmable potentiometer, e.g., EEPOT. As stated earlier, this non-linear reference signal is compared with the power detector's voltage output. The power detector output is provided directly to the comparator from the power detector absent any intermediate circuitry such as linearization circuits that have been used in prior art circuits, which would tend to add cost to the control loop. It should be noted that the power detector may be a temperature compensated power detector adjusting for variations in circuit operation due to changes in temperature. Further, it should be noted that the comparator preferably incorporates a filter to filter, the comparator output to provide a stable output signal and to set the loop bandwidth. The linear power output control loop is able to provide a substantially linear output in terms of dB per linear adjustment of the reference signal, due to the logarithmic nature of the reference signal.

A method for controlling a power amplifier to produce a substantially linear power output in dBs generally includes the following steps: (1) providing a power input to the power amplifier; (2) producing a power output from the power amplifier; (3) detecting the power output; (4) providing an adjustable, non-linear reference signal; (5) comparing the adjustable, non-linear reference signal voltage with the detected power output voltage; (6) producing an error output that is representative of the difference between the non-linear reference signal and the detected power output voltage; (7) providing the error voltage to the power amplifier in the form of a control input; and (8) amplifying the power input with the power amplifier with a suitable gain in response to the control input in order to achieve the desired output power, whereby the output power is linear with respect to each adjustment in the non-linear reference signal. Of course, the above-mentioned steps may be performed in any appropriate order.

DETAILED DESCRIPTION OF THE PREFERRED EMBODIMENTS

Figure 1:
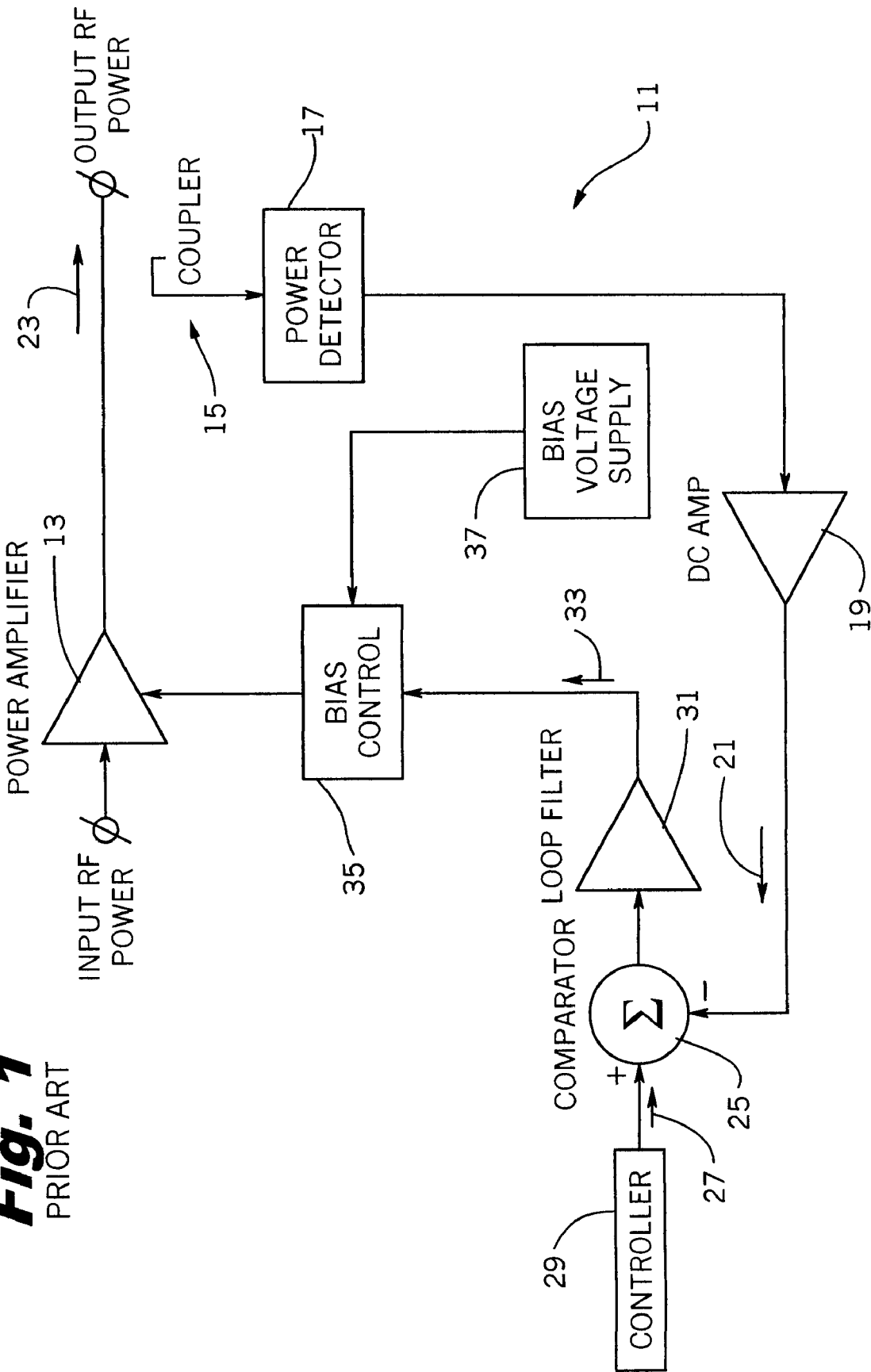
FIG. 1 depicts a conventional, prior art, linear power control loop circuit.

As shown in FIG. 1, a conventional power control circuit 11 is typically comprised of the power amplifier 13 under control, an output power sampler or coupler 15 and a power detector 17, which usually comprises a diode rectifier, an associated conditioning circuit 19 that generates a DC voltage, represented by arrow 21, proportional to the output power 23 of the amplifier 13, and a voltage comparator 25 that compares the feedback voltage 21 from the power detector 17, after being linearized in conditioning circuit 19, to that of an input reference voltage 27. The input reference voltage 27 typically comes from a digital controller 29. A loop filter 31 tailors the response of the control loop to assure loop stability as well as other loop characteristics including loop damping, bandwidth, and responsiveness.

The difference between the control input voltage 27 and the feedback voltage 21 is an error voltage 33. This error voltage is used to drive an amplifier biasing circuit 35 with a bias voltage supply 37 or an attenuator placed at the input or output of the amplifier 13. The system loop is a closed loop control unit and acts in such a way as to force a null condition to exist in the comparator 25, such that the input reference voltage 27 equals the feedback voltage 21.

The overall purpose of the power amplifier output control loop is to maintain a constant output power proportional to a reference signal in order to avoid output power variations due to changes in temperature and supply voltages. The controller 29 typically contains a lookup table for the power sensor voltages as a function of the true output level of the power amplifier.

Figure 2:
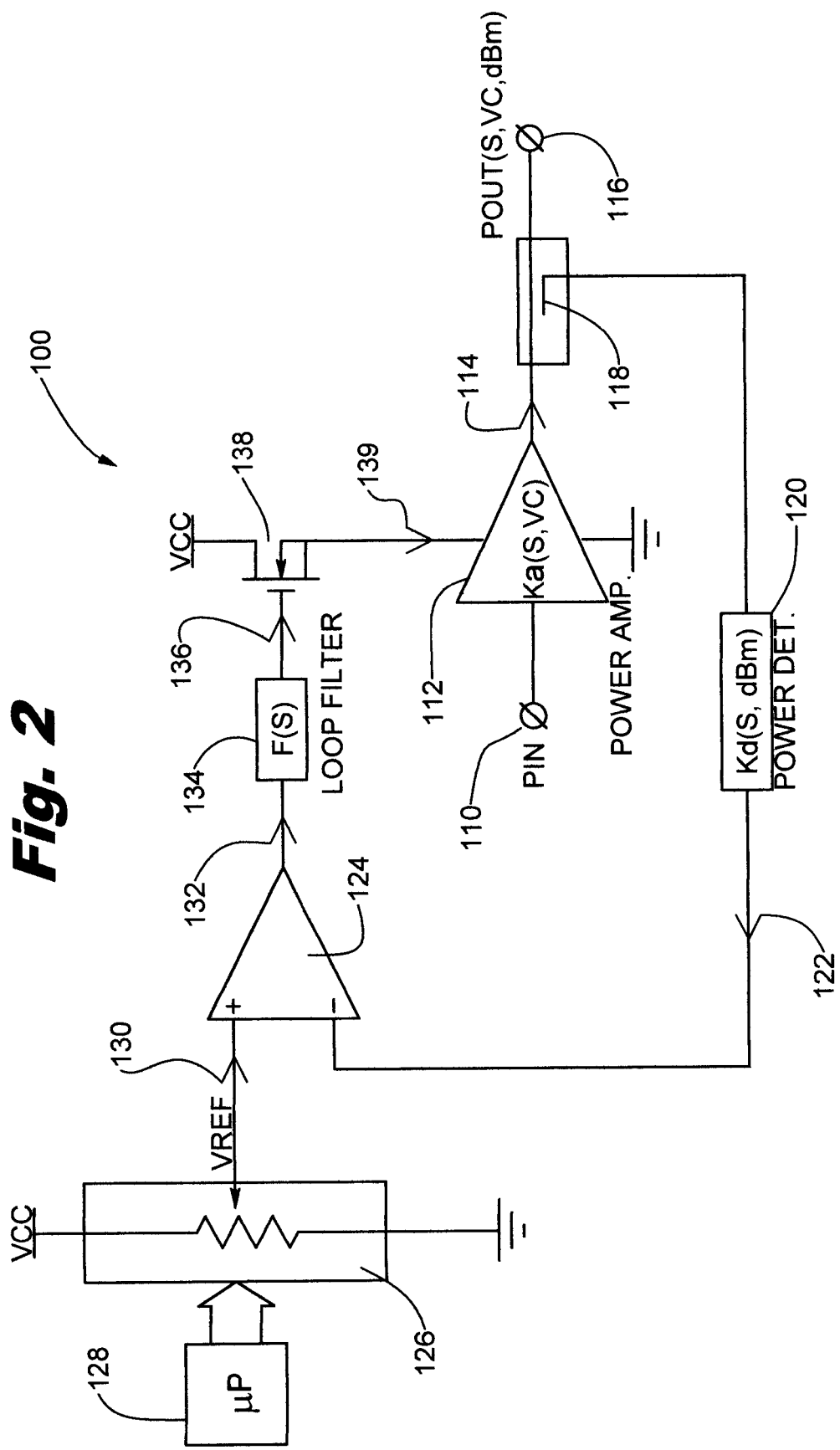
FIG. 2 depicts a linear power control loop schematic of the present invention.

Referring now to FIG. 2, a linear power control loop 100 of the present invention is depicted. Linear power control loop 100 eliminates the need for a linearization circuit for the power detector and provides a wide dynamic range of control, e.g., a linear transfer function of dB per adjustment step, by utilizing a non-linear reference to control a power amplifier's output power. Further, this wide dynamic range of control may be provided over a wide range of temperatures, e.g., over 125° C. As such, linear control loop 100 of the present invention can be used with substantially all power amplifiers when linear control in terms of dBm versus linear adjustment setting is desired.

An RF signal is introduced to the linear power control loop 100 via input terminal 110 which is coupled to a controlled RF power amplifier 112, which provides an amplified RF signal, represented by arrow 114 to output terminal 116. Coupled to the output of power amplifier 112 are a signal sampler 118 and a power detector 120. And, unlike the prior art, power detector 120 provides an output signal, represented by arrow 122, directly to a summing amplifier 124; no additional circuitry is used in between power detector 120 and summing amplifier 124 to linearize output signal 122. The other input to summing amplifier 124 also differs significantly from the prior art in that it is provided by an electrically erasable potentiometer (EEPOT) 126, e.g., an $E^2POT$ manufactured by Xicor or other suitable EEPOTs, which can be programmed by a microprocessor 128. The EEPOT output voltage, represented by arrow 130, is compared with signal 122 to produce an error signal 132 at the output of summing amplifier 124. Error signal 132 is filtered by loop filter 134 which also sets the closed loop bandwidth of the loop. The output signal of loop filter 134, represented by arrow 136, is tied to the gate of a biasing n-channel MOSFET 138. The drain of MOSFET 138 is connected to a voltage source, $V_{CC}$, while the body of MOSFET 138 is tied to its source and provides the biasing control voltage $V_C$, represented by arrow 139, to power amplifier 112. As such, linear power control loop 100 operates as a closed loop to produce a linear output by forcing a null condition, with exponential signals, at summing amplifier 124 such that output signal 122 of power detector 120, i.e., the feedback voltage, equals output 130 of EEPOT, i.e., the loop reference voltage.

Figure 3:
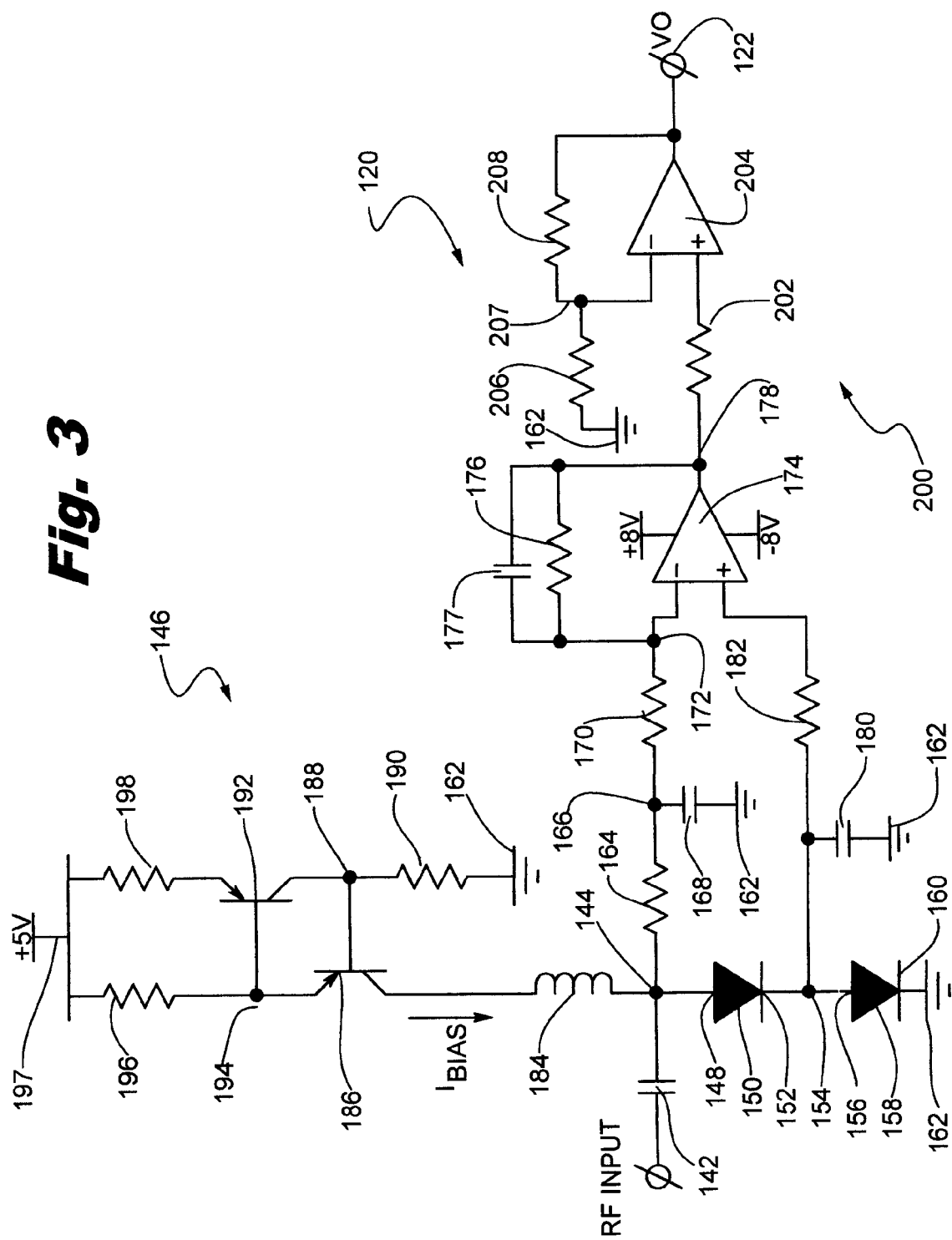
FIG. 3 depicts a circuit diagram of an embodiment of a power detector that may be used with the linear power control loop of the present invention.

Signal sampler 118 is of a standard configuration as is known in the art. Power detector 120, however, is preferably of the configuration as depicted in FIG. 3. Power detector of FIG. 3 is a temperature compensating power detector, which additionally incorporates a current source 146 and a multiplier circuit 200. Power detector 120 includes a coupling capacitor 140 that is connected between sampled power input 142 and node 144. A current source 146 is also coupled to node 144 which is connected to node 154 which is connected to anode 156 of temperature compensation diode 158. Cathode 160 of temperature compensation diode 158 is connected to ground 162. A resistor 164 is connected between node 144 and node 166 while a capacitor 168 is connected between node 166 and ground 162. A resistor 170 is connected between node 166 and a node 172. Node 172 is fed to the inverting input of amplifier 174. A feedback resistor 176 connects node 172 and voltage output 178 of amplifier 174. A capacitor 180 is connected between node 154 and ground 162. And, a resistor 182 is connected between node 154 and the non-inverting input of amplifier 174. A capacitor Ccomp 177, connects node 172 and voltage output 178 at amplifier 174.

As shown, detector diode 150 and temperature compensation diode 158 are in DC series with each other allowing the same current to flow through both diodes and, thus, developing a substantially identical voltage drop across both diodes. Optimal performance, i.e., closer matching of the voltage drop across the diodes, can be achieved if matching diodes in the same package are used. Resistors 170, 176, and 182 are preferably selected such that $R_{170}=R_{176}=R_{182}$. The preferred component values are provided below in Table 1, of course, other component values may be used without departing from the spirit or scope of the invention.

TABLE 1

| Capacitor 140 | 18 picoFarads |
| Resistor 164 | 360 Ohms |
| Capacitor 168 | 22 picoFarads |
| Capacitor 180 | 1000 picoFarads |
| Ccomp 177 | 47 picoFarads |
| Resistor 170, 176, 182 | 100 KiloOhms |

Thus, the affect on power detector output voltage 178 due to a change in voltage drop across diodes 150 and 158 due to temperature variation may be determined by reviewing power detector 120 in a static state, i.e., no power input. The detector output voltage is defined as follows:

$$V_O = \frac{-R_{176}}{R_{170}}(V_{144}) + V_{154}\left(\frac{R_{176}}{R_{170}} + 1\right) \quad \text{Eq. 1}$$

where, in the static state:

$V_{144} = 2V_D$ and $V_{154} = V_D$.

Note that $V_{144}$ is the voltage at node 144, $V_{154}$ is the voltage at node 154, and VD is the voltage across one diode. Knowing that $R_{176} = R_{170}$ and substituting $V_{144}$ and $V_{154}$, Equation 1 becomes:

$$V_O = -2V_D + 2V_D = 0 \quad \text{Eq. (2)}$$

Thus, the change in diode voltage due to temperature change is canceled out, allowing power detector 120 to provide a true voltage output that is unaffected by temperature. It should be noted that, while power detector 120, as shown in FIG. 3, is the preferred embodiment of a power detector, other suitable power detectors 120 may be used without departing from the spirit or scope of the invention.

Figure 4:
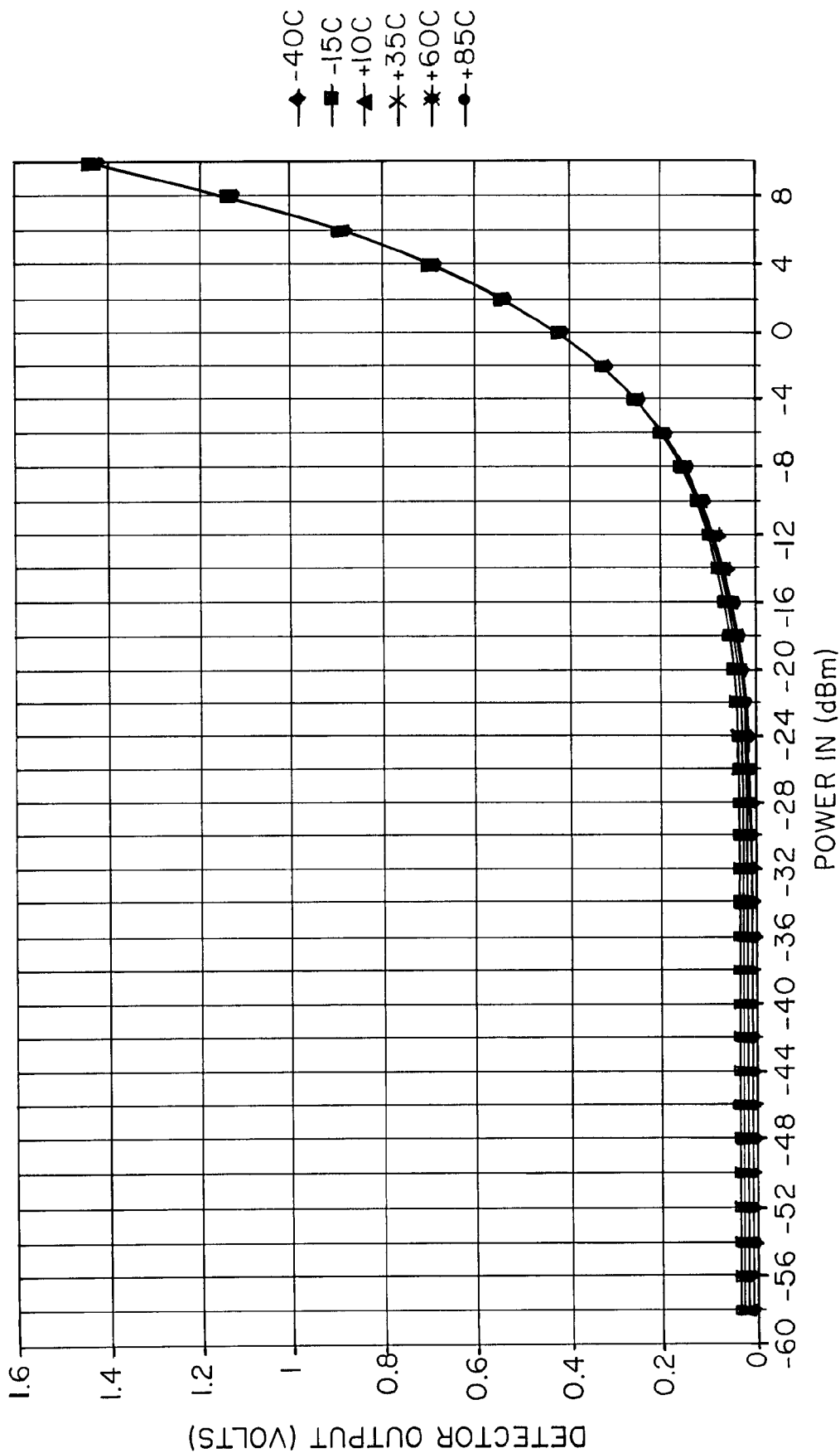
FIG. 4 is a plot depicting power input to the power detector of FIG. 3 versus the output voltage of the power detector of FIG. 3 over a range of temperatures.

FIG. 4 provides a plot that is representative of the operation of power detector 120. The plot depicts power detector output voltage versus power input in dBms at the temperatures of $-40°$ C., $-15°$ C., $+10°$ C., $+35°$ C., $+60°$ C., and $+85°$ C. As the plot indicates, the output voltage is substantially consistent for a given power input over the range of temperatures. The plot also indicates that as the power into power detector 120 increases, the voltage level of signal output 122 of power detector 120 increases exponentially.

Current source 146 for power detector 120, shown in FIG. 3, may be described as follows. First, current source 146 preferably includes an inductor 184 connected between node 144 and the collector of a pnp transistor 186. The base of transistor 186 is tied to node 188. A resistor 190 is tied between node 188 and ground 162. The collector of a second pnp transistor 192 is also tied to node 188. The base of transistor 192 is connected to a node 194. A resistor 196 is connected between node 194 and a positive voltage supply 197, i.e., +5 volts. A resistor 198 is provided between positive voltage supply 197 and the emitter of transistor 192. The preferred component values for current source 146 are provided below in Table 2, of course, other component values may be used without departing from the spirit or the scope of the invention.

TABLE 2

| Inductor 184 | 18 milliHenries |
|---|---|
| Resistor 190, 198 | 200 kiloOhms |
| Resistor 196 | 240 kiloOhms |

With the component values of Table 2, current source 146 is able to provide power detector 120 with a bias current of approximately 10 microAmps. It should be noted that other current sources may be used without departing from the spirit or scope of the invention.

Along with current source 146, power detector 120 preferably utilizes a multiplier circuit 200, as shown in FIG. 3. Multiplier circuit 200 includes a resistor 202 connected between voltage output 178 of amplifier 174 and the non-inverting input of an amplifier 204. A resistor 206 is connected between a node 207 and ground 162. Node 207 is coupled to the inverting input of amplifier 204. A feedback resistor 208 is connected between node 207 and output signal 122. The preferred component values of multiplier circuit 200 may be found in Table 3, of course, other component values may be used without departing from the spirit or scope of the invention.

TABLE 3

| Resistor 202, 206 | 10 KiloOhms |
|---|---|
| Resistor 208 | 20 KiloOhms |

With the component values of Table 3, multiplier circuit 200 operates to multiply, by a factor of approximately three, output signal 178 to place the voltage of output signal 122 within the output range of EEPOT 126, e.g., approximately 0 to 4.5 volts.

The total contribution from power detector 120, with reference to FIG. 3, to linear power control loop performance, in terms of frequency and input power, may be defined as follows:

Eq. (3)

$$K_d(s, dBm) = K_D(dBm) * \frac{1}{s\tau_{d1}+1} * \frac{G}{s\tau_{d2}+1} *$$

$$\frac{A_O(s)}{1+A_O(s)+\dfrac{G}{s\tau_{d2}+1}} * \frac{A_O(s)}{1+A_O(s)*\dfrac{R_{206}}{R_{206}+R_{208}}}$$

where:

$$K_D(dBm) = \frac{\partial V_{DET}(Pwr)}{\delta(Pwr)},$$

where $V_{DET}$(Pwr) is the non-linear transfer function of the power detector 120 (units are in Volts/dBm), $$G = \frac{R_{176}}{R_{170}}, \quad \tau_{d1} = \left(\frac{2V_{Diode150}}{I_{Bias}} + R_{164}\right)C_{168},$$

$$\beta_{OL} = \frac{GBP}{A_{OL}}, \text{ and } \tau_{d2} = C_{Comp}R_{176}.$$

Note that GBP is the gain bandwidth product of amplifier 174 and $A_{OL}$ is the open-circuit DC voltage gain of amplifier 174.

Referring once again to FIG. 2, it can be seen that EEPOT 126 provides its output 130 to summing amplifier 124. EEPOT 126 is preferably one with a logarithmic taper having a dynamic range of 30 dB or more. A Xicor, Inc., digitally controlled potentiometer having Model No. X9314 has been found to be a suitable EEPOT 126, of course, other EEPOTs may be used without departing from the spirit of scope of the invention. An EEPOT 126 is typically implemented by a resistor array composed of multiple resistive elements and a wiper switching network. Between each resistive element and at either end are tap points accessible to the wiper terminal. The position of the wiper is controlled by microprocessor 128. The high and low terminals of EEPOT 126 are equivalent to the fixed terminal of a mechanical potentiometer. The maximum and minimum voltages out of EEPOT 126 are preferably set to approximately 4.6 and 0 volts, respectively. Note that this range corresponds to the range of the voltage signal Output 122 of power detector 120. As such, the resistance of EEPOT 126 and its corresponding output voltage signal 130 are adjustable in thirty-two incremental steps (between approximately 0 and 4.6 volts), of course, other resistance ranges and the number of incremental steps may be used without departing from the spirit or scope of the invention.

Figure 5:
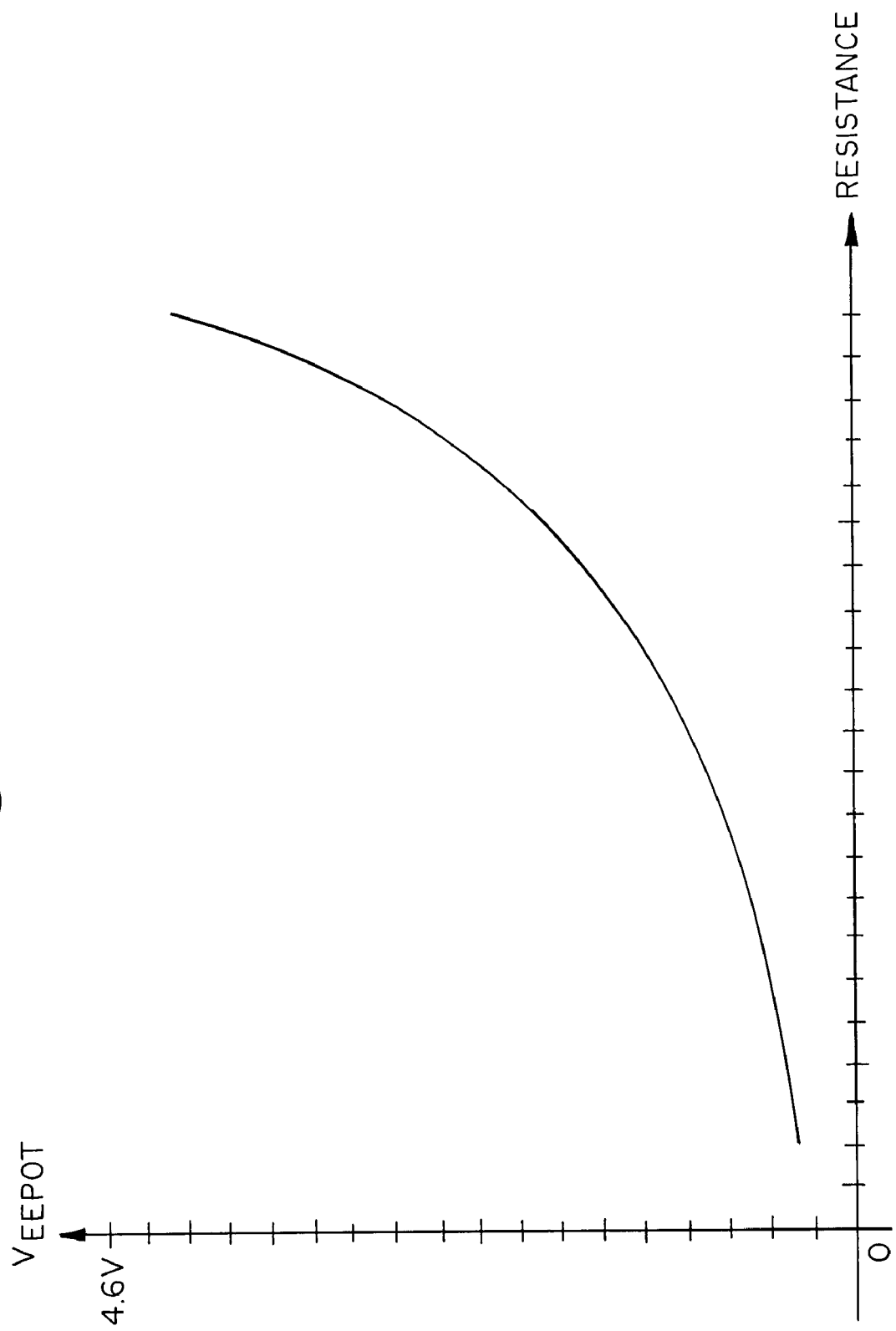
FIG. 5 is a plot depicting the changing resistance of a programmable potentiometer versus the output voltage of the programmable potentiometer; the programmable potentiometer is preferably used in the linear power loop control circuit of the present invention, as shown in FIG. 2.

FIG. 5 provides a plot that is representative of the voltage level of EEPOT output signal 130 as the resistance of EEPOT 126 is adjusted. As the plot indicates, output voltage signal 130 increases exponentially as the resistance of EEPOT 126 is increased linearly.

Figure 6:
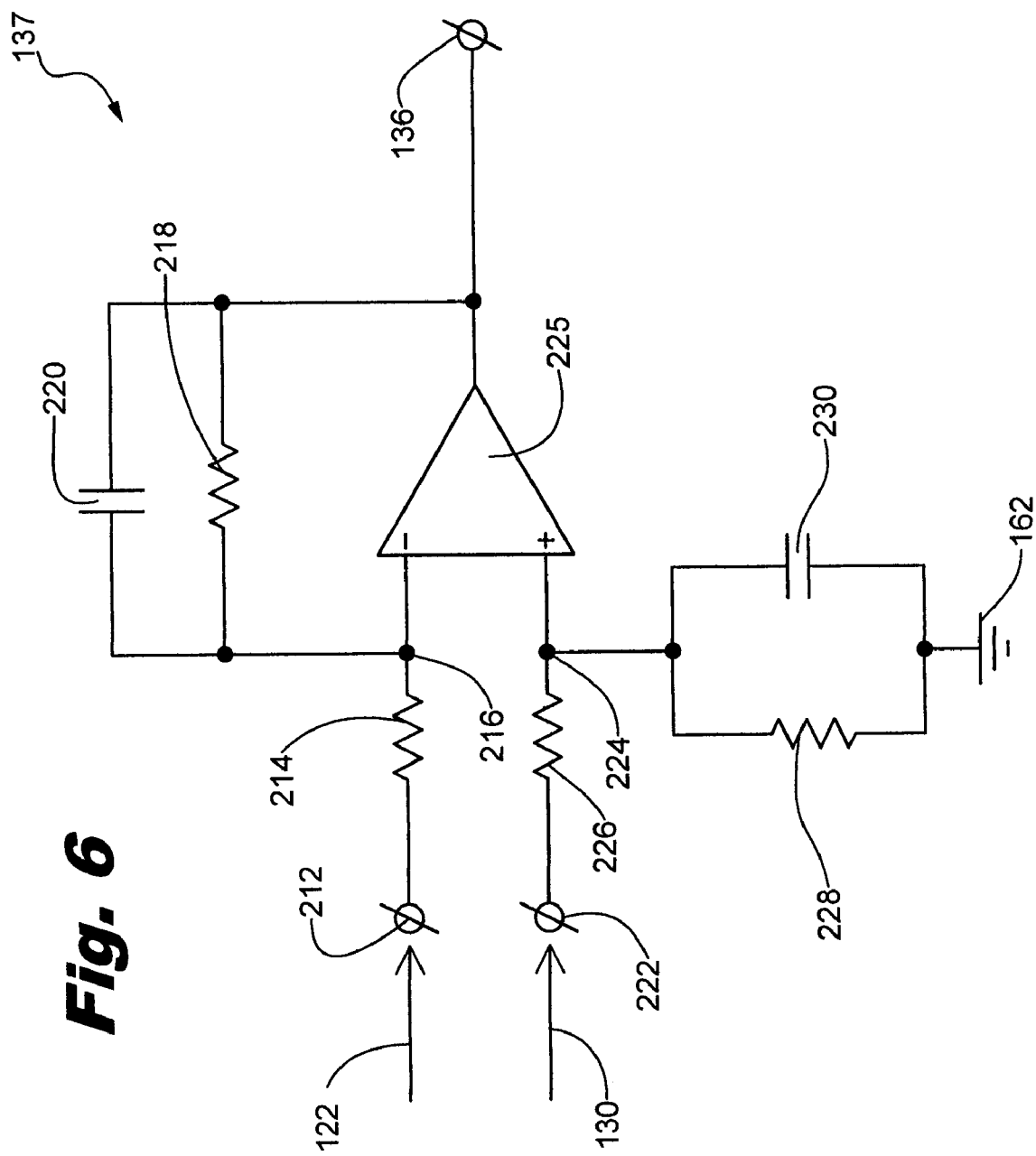
FIG. 6 is a circuit diagram of an embodiment of a summing amplifier and loop filter that may be used with the linear power control loop of the present invention.

Referring to FIG. 6, a circuit diagram of the preferred embodiment of summing amplifier 124 and loop filter 134 is provided. As shown, a summing amplifier has been implemented within a circuit that has been configured to also act as the loop filter, with a single pole response, as well as a summer. As such, the combination summing amplifier/loop filter 137 may be described as follows. First is a node 212 which receives output voltage signal 122. Connected between node 212 and a node 216 is a resistor 214. Node 216 is fed to the inverting input of operational amplifier 225. A parallel combination of a resistor 218 and a capacitor 220 is provided between node 216 and the output 236 of summing amplifier/loop filter 137. A node 222 receives output voltage signal 130. Connected between node 222 and a node 224 is a resistor 226. Connected between node 224 and ground 162 is a parallel combination of a resistor 228 and a capacitor 230. Node 224 is fed to the non-inverting input of operational amplifier 225. The preferred component values of summing amplifier/loop filter 137 are provided below in Table 4, of course other component values may be used without departing from the spirit or scope of the invention.

TABLE 4

| Resistor 214, 226 | 160 Ohms |
| Resistor 220, 228 | 200 kiloOhms |
| Capacitor 220, 230 | 0.1 microFarads |

Operational amplifier 124 operates to provide an error voltage output 236 that is representative of the difference in voltage between output voltage signal 122 and output voltage signal 130, i.e., $V_{122} - V_{130}$. Loop filter operates as a low pass filter acting to stabilize the error voltage signal to power amplifier 112.

The total transfer function of the summing amplifier/loop filter 137, with reference to FIG. 6, in respect to linear power control loop performance, in terms of frequency, may be defined as follows:

$$F(s) = \frac{G}{s\tau_1 + 1} * \frac{A_{OL2}(s)}{1 + A_{OL2}(s) + \frac{G}{s\tau_1 + 1}} \qquad \text{Eq. (4)}$$

where:

$$A_{OL2}(s) = \frac{A_{OL2}}{\frac{s}{\beta_{OL2}} + 1}, \quad G = \frac{R_{218}}{R_{214}}, \quad \tau_1 = R_{218}C_{220}, \text{ and}$$

$$\beta_{OL2} = \frac{GBP2}{A_{OL2}}.$$

Note that GBP2 is the gain bandwidth product and $A_{OL2}$ is the open-circuit DC voltage gain of amplifier 174.

Referring once again to FIG. 2, output 136 of loop filter 134 is tied to the gate of MOSFET 138. MOSFET 138 provides the biasing control voltage 139 to power amplifier 112.

The transfer function of the power amplifier 112 in respect to linear power control loop performance, in terms of the control voltage, $V_C$, may be defined as follows:

$$K_a(s, V_C) = K_A(V_C) * \frac{1}{s\tau_{mos} + 1} \qquad \text{Eq. (5)}$$

where:

$$K_A(V_C) = \frac{\partial P_{OUT}(V_{CONT})}{\partial (V_{CONT})} \quad \text{and} \quad \tau_{mos} = \frac{1}{2\pi(timeconst.)},$$

where $P_{OUT}(V_{CONT})$ is the non-linear transfer function of the power amplifier (units arc in dBm/volts). The time constant is from the frequency response of MOSFET 138.

As such, in view of the above, the closed loop response of the linear power control loop 100 includes the transfer function of power amplifier 112 and the transfer function of power detector 120, and may be defined as follows:

$$P_{OUT}(s, dBm, V_{CONT}) = \frac{K_a(s, V_{CONT}) * F(s)}{1 + F(s) * K_a(s, V_{CONT}) * K_d(s, dBm)} \qquad \text{Eq. (6)}$$

where F(s) has been defined as summing amplifier/loop filter 137.

Figure 7:
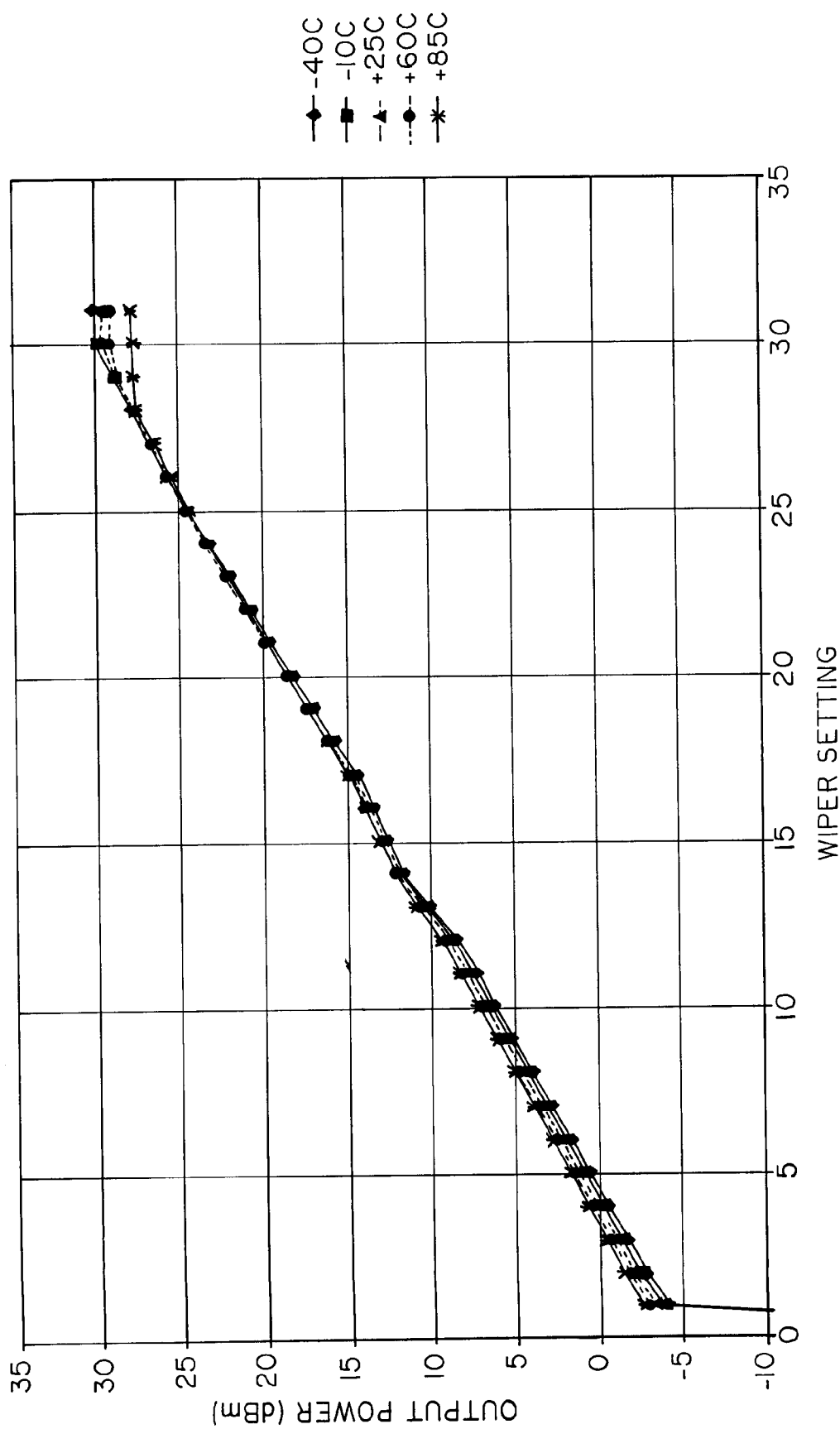
FIG. 7 is a plot depicting linear power control loop output versus adjustment in wiper setting of the programmable potentiometer over a range of temperatures.

In view of the above, it can be seen that linear power control loop 100 operates as a closed loop to produce a linear output 116 by forcing a null condition, with exponential signals, at summing amplifier 124 such that the output signal of power detector 120, i.e., the feedback voltage, equals the output 130 of EEPOT 126, i.e., the reference voltage. FIG. 7 provides a plot depicting operation of linear power control loop 100. The plot depicts linear power control loop output 116 in dBm versus the wiper terminal setting, e.g., adjustment step, of EEPOT 126 at the temperatures of –40° C., –10° C., +25° C., +60° C., and +85° C. As the plot indicates, linear power control loop output 116 is substantially linear per linear adjustment of the wiper terminal of EEPOT 126, i.e., per stepped up increase in resistance of EEPOT.

The present invention may be embodied in other specific forms without departing from the spirit of the essential attributes thereof, therefore, the illustrated embodiments should be considered in all respects as illustrative and not restrictive, reference being made to the appended claims rather than to the foregoing description to indicate the scope of the invention.

What is claimed:

1. A closed power control loop that produces a linear transfer function in response to an adjustable non-linear reference input, comprising:

an adjustable power amplifier, wherein said adjustable power amplifier includes a power input, a control input and a power output;

a power detector, wherein said power detector detects said power output of said adjustable power amplifier and produces a power detector output;

an adjustable, non-linear reference signal; and a comparator wherein said comparator compares said power detector output with said reference signal and produces a comparator output representative of the difference between said power detector output and said reference signal, wherein said comparator output is provided to said power amplifier in the form of said control input and said power amplifier adjusts said power input with said control input to produce a non-linear power output variation, wherein said non-linear power output variation is substantially linear with respect to an adjustment in said non-linear reference signal said adjustable non-linear reference signal being provided by a programmable potentiometer (EEPOT).

2. The closed power control loop of claim 1, wherein said power detector output is a non-linear signal.

3. The closed power control loop of claim 1, wherein said adjustable, non-linear reference signal is adjusted exponentially.

4. The closed power control loop of claim 3, wherein the exponential adjustment is performed through a plurality of linear steps.

5. The closed power control loop of claim 1, further comprising a loop filter wherein said loop filter sets a control loop bandwidth.

6. The closed power control loop of claim 1, wherein said control input is non-linear.

7. The closed power control loop of claim 1, wherein said non-linear output power variation is exponential.

8. A closed power control loop that produces a linear transfer function in response to an adjustable non-linear reference input, comprising:

power amplifying means for receiving and amplifying a power input, for receiving a control input, and for producing a power output, wherein amplifying said power input is performed in response to the received control input to produce a non-linear variation of said power output;

power detection means for detecting said power output of said power amplifying means and for producing a power detection means output;

adjustable input means for providing an adjustable non-linear reference output; and comparison means for comparing said power detection means output with said reference output and for providing a comparison means output representative of the difference between said power detection means output and said reference output, wherein said comparison means output is provided to said power amplifying means in the form of said control input and wherein said non-linear variation of said power output is substantially linear with respect to an adjustment in said non-linear reference output said adjustable input means being a programmable potentiometer (EEPOT).

9. The closed power control loop of claim 8, wherein said power detection means output is non-linear.

10. The closed power control loop of claim 8, wherein said adjustable non-linear reference output is adjusted exponentially.

11. The closed power control loop of claim 10, wherein the exponential adjustment is performed through a plurality of linear steps.

12. The closed power control loop of claim 8, further comprising filter means for setting a closed loop bandwidth.

13. The closed power control loop of claim 8, wherein said control input is non-linear.

14. The closed power control loop of claim 8, wherein said non-linear variation of said power output is exponential.

15. A method for controlling a power amplifier to produce a substantially linear transfer function in response to an adjustable non-linear reference input, comprising the steps of:

providing a power input to said power amplifier;

producing a power output from said power amplifier;

detecting said power output;

providing an adjustable, non-linear reference signal;

comparing said reference signal with the detected power output;

producing a comparison output representative of the difference between said reference signal and said detected power output;

providing said comparison output to said power amplifier in the form of a control input; and amplifying said power input with said power amplifier in response to said control input to produce a non-linear variation in said power output, adjusting said adjustable non-linear reference signal, wherein said non-linear power output variation is substantially linear with respect to the adjustment in said non-linear reference signal said adjustable non-linear reference signal being provided by a programmable potentiometer ($E^2$POT).

16. The method of claim 15, wherein the step of adjusting comprises adjusting said adjustable non-linear reference signal exponentially.

17. The method of claim 16, wherein adjusting said adjustable non-linear reference signal exponentially is performed through a plurality of linear steps.

* * * * *

UNITED STATES PATENT AND TRADEMARK OFFICE
CERTIFICATE OF CORRECTION

PATENT NO.   : 6,417,729 B1
DATED        : July 9, 2002
INVENTOR(S)  : Normand T. Lemay, Brian Brunn, John MacConnell, Eric Sadowski and Eric Lofstad It is certified that error appears in the above-identified patent and that said Letters Patent is hereby corrected as shown below:

Column 1,
Line 44, please insert -- of -- between "range" and "temperature".
Line 49, please change "arc" to -- are --.

Column 5,
Line 14, please change "VD" to -- $V_D$ --.
Line 28, please change "dBms" to -- dBm --.

Column 6,
Line 54, please change "of" to -- or --.
Line 65, please change "Output" to -- output --.

Column 8,
Line 15, please change "arc" to -- are --.
Line 43, please change "thereof," to -- thereof; --.

Signed and Sealed this

Twenty-eighth Day of January, 2003

JAMES E. ROGAN
*Director of the United States Patent and Trademark Office*